United States Patent
Kong

(10) Patent No.: US 7,755,455 B2
(45) Date of Patent: Jul. 13, 2010

(54) SAW FILTER FREQUENCY CHARACTERISTIC CONTROL

(75) Inventor: Alvin Ming-Wei Kong, Manhattan Beach, CA (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 156 days.

(21) Appl. No.: 11/901,568

(22) Filed: Sep. 18, 2007

(65) Prior Publication Data

US 2009/0072926 A1   Mar. 19, 2009

(51) Int. Cl.
*H03H 9/00* (2006.01)
*H01L 41/047* (2006.01)

(52) U.S. Cl. ...................... 333/193; 333/133
(58) Field of Classification Search ............... 333/133, 333/187, 188, 189, 190, 191, 192, 193, 194, 333/195, 196

See application file for complete search history.

(56) References Cited

U.S. PATENT DOCUMENTS

| 4,401,956 | A | | 8/1983 | Joshi |
| 5,028,101 | A | * | 7/1991 | Sugai et al. .................. 333/193 |

* cited by examiner

*Primary Examiner*—Dean O Takaoka
(74) *Attorney, Agent, or Firm*—Carmen Patti Law Group, LLC

(57) ABSTRACT

An apparatus in one example comprises an insulating piezoelectric layer, a base electrode along a first side of the insulating piezoelectric layer, and at least one gradient electrode along a second side of the insulating piezoelectric layer. The at least one gradient electrode is configured to provide a voltage gradient across an aperture of a surface acoustic wave (SAW) filter. The base electrode and the at least one gradient electrode are configured to provide a voltage bias across the insulating piezoelectric layer. The voltage bias comprises a gradient based on the voltage gradient across the aperture of the SAW filter. The base electrode and the at least one gradient electrode are configured to control at least one frequency characteristic of the SAW filter based on the voltage bias across the insulating piezoelectric layer.

19 Claims, 6 Drawing Sheets

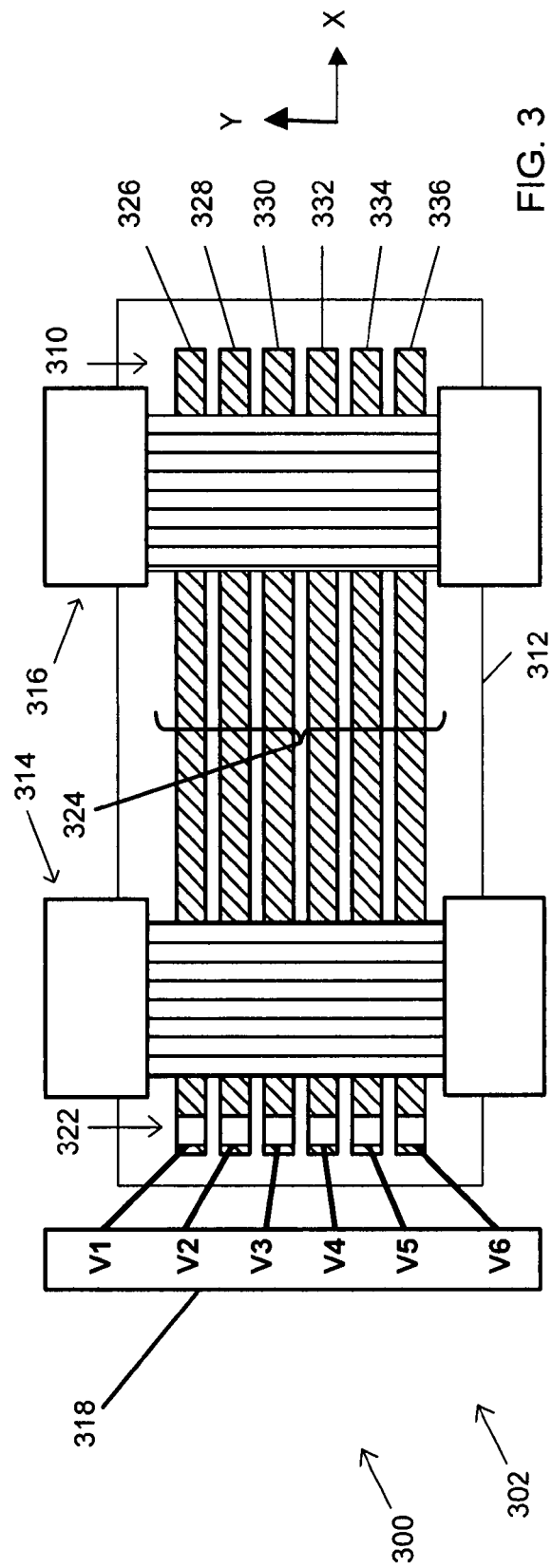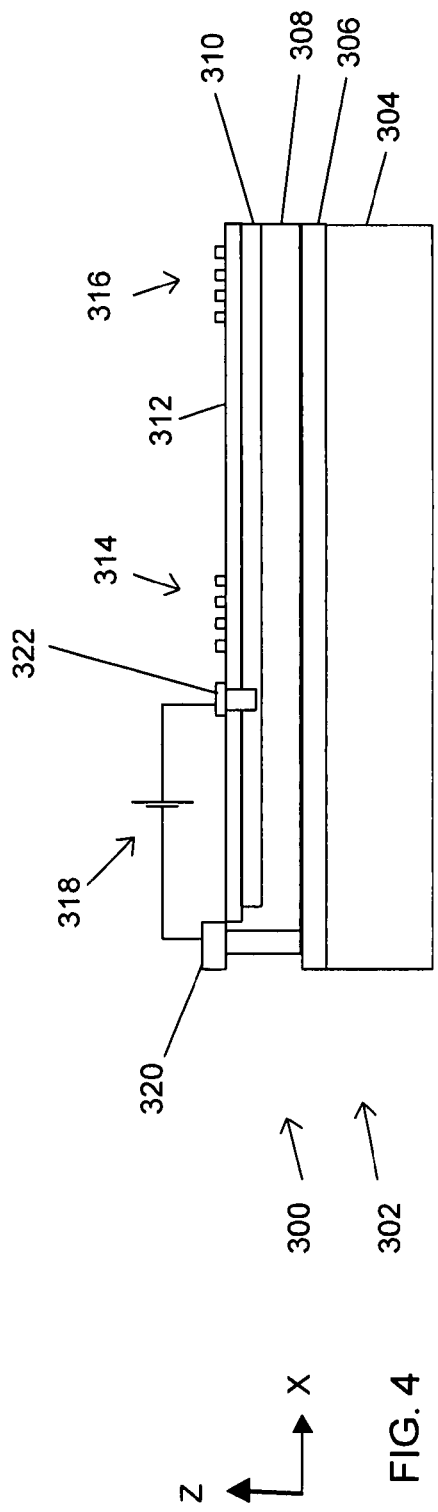

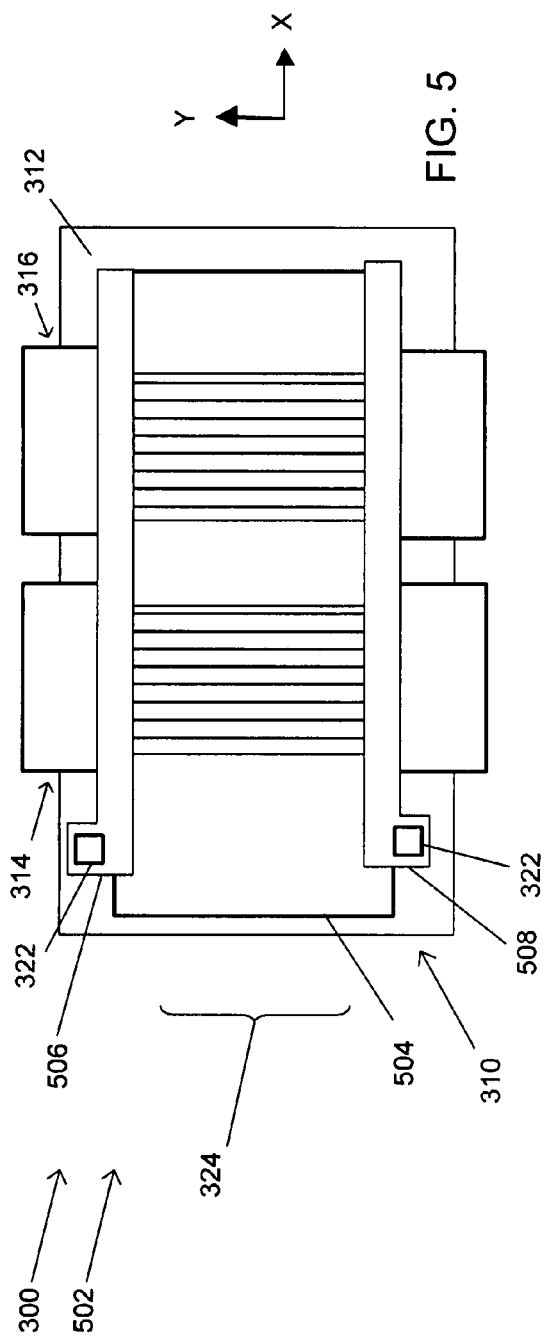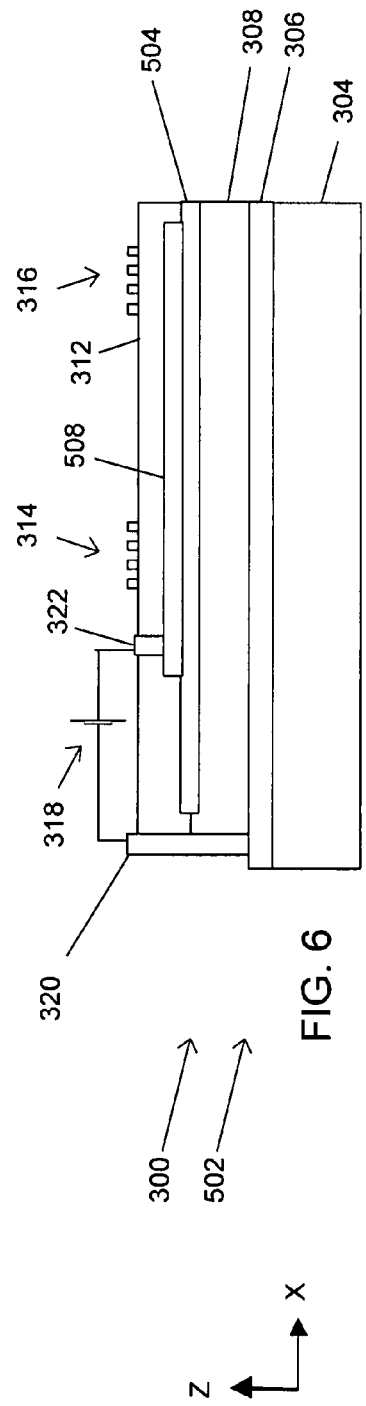

SAW FILTER FREQUENCY CHARACTERISTIC CONTROL

CROSS-REFERENCE TO RELATED APPLICATIONS

This application contains subject matter that is related to the subject matter of the following applications, which are assigned to the same assignee as this application. The below-listed applications are hereby incorporated herein by reference in their entireties:

"ELECTRIC FIELD CONTROL OF SURFACE ACOUSTIC WAVE VELOCITY," by Stokes et al., application Ser. No. 11/504,372, filed Aug. 15, 2006.

"SURFACE ACOUSTIC WAVE PASSBAND CONTROL," by Stokes et al., application Ser. No. 11/788,081, filed Apr. 18, 2007.

TECHNICAL FIELD

The invention relates generally to surface acoustic wave devices and more particularly to control of acoustic velocity in surface acoustic wave devices.

BACKGROUND

Known Surface Acoustic Wave ("SAW") devices often utilize input and output interdigital transducers (IDTs) spaced apart from each other on the surface of a solid with piezoelectric properties. In one example, the solid comprises a single crystal of a piezoelectric material, such as quartz. In another example, the solid comprises one or more thin films, some of which are piezoelectric, deposited on a non-piezoelectric single crystal substrate. The input IDT converts an input electrical signal to a surface acoustic wave in the SAW device. The surface acoustic wave propagates along the surface of the solid to the output IDT. The output IDT converts the surface acoustic wave to an output electrical signal. The propagation path along the surface of the solid serves as a delay path for the surface acoustic wave. It takes a certain amount of time for the surface acoustic wave to travel from the input IDT to the output IDT. The amount of time is dependent on the material properties of the solid and the acoustic path length between the input and output IDTs.

The center frequency of a SAW device is based on the geometry of the IDTs. After the solid and IDTs have been formed and integrated into a SAW device, the center frequency of the SAW device is fixed. To produce a SAW device with a different center frequency, a designer could either select a different solid material configuration or a different IDT geometry for the SAW device. In one example, the designer could select a piezoelectric crystal with a different acoustic velocity to change the center frequency of the SAW device. In another example, the designer could change the geometry of the IDTs on the piezoelectric layer to change the center frequency of the SAW device. As one shortcoming, the center frequency of such SAW devices is fixed at fabrication. The ability to frequency tune SAW devices in prior attempts has been limited.

Thus, a need exists for improved control of the acoustic velocity of a surface acoustic wave on the surface of the solid in a SAW device.

SUMMARY

The invention in one implementation encompasses an apparatus. The apparatus in one example comprises an insulating piezoelectric layer, a base electrode along a first side of the insulating piezoelectric layer, and at least one gradient electrode along a second side of the insulating piezoelectric layer. The at least one gradient electrode is configured to provide a voltage gradient across an aperture of a surface acoustic wave (SAW) filter. The base electrode and the at least one gradient electrode are configured to provide a voltage bias across the insulating piezoelectric layer. The voltage bias comprises a gradient based on the voltage gradient across the aperture of the SAW filter. The base electrode and the at least one gradient electrode are configured to control at least one frequency characteristic of the SAW filter based on the voltage bias across the insulating piezoelectric layer.

Another implementation of the invention encompasses a surface acoustic wave (SAW) filter. The surface acoustic wave filter comprises an insulating piezoelectric layer, a base electrode, at least one gradient electrode, an input transducer, and an output transducer. The base electrode is formed along a first side of the insulating piezoelectric layer. The at least one gradient electrode is formed along an opposing side of the insulating piezoelectric layer. The base electrode and the at least one gradient electrode are configured to provide a voltage bias across an aperture of the insulating piezoelectric layer between the input transducer and the output transducer. The base electrode and the at least one gradient electrode are configured to control at least one of a center frequency and a fractional bandwidth of the SAW filter based on the voltage bias across the insulating piezoelectric layer.

A further implementation of the invention encompasses a method. A base electrode is formed as a first doped semiconductor layer. An insulating piezoelectric layer is formed on the base electrode as a second semiconductor layer. At least one gradient electrode is formed on the insulating piezoelectric layer as a third doped semiconductor layer. The at least one gradient electrode is configured to provide a voltage gradient across an aperture of a surface acoustic wave (SAW) filter. The at least one gradient electrode is configured to provide a voltage bias across the insulating piezoelectric layer. The voltage bias comprises a gradient based on the voltage gradient across the aperture of the SAW device.

DESCRIPTION OF THE DRAWINGS

Features of example implementations of the invention will become apparent from the description, the claims, and the accompanying drawings in which:

FIG. 3 is a top view representation of one implementation of an apparatus that comprises a surface acoustic wave filter.

FIG. 4 is a side view representation of the surface acoustic wave filter of FIG. 3.

FIG. 5 is a top view representation of another implementation of an apparatus that comprises a surface acoustic wave filter.

FIG. 6 is a side view representation of the surface acoustic wave filter of FIG. 5.

DETAILED DESCRIPTION

Figure 1:
FIG. 1 is a representation of one implementation of an apparatus that comprises a regular interdigital transducer.

Turning to FIG. 1, one example of a prior art surface acoustic wave (SAW) filter 102 comprises a regular interdigital transducer (IDT). The regular IDT comprises a plurality of fingers 104 that are substantially parallel. Where the plurality of fingers 104 are parallel, the IDT has limited fractional bandwidth.

Figure 2:
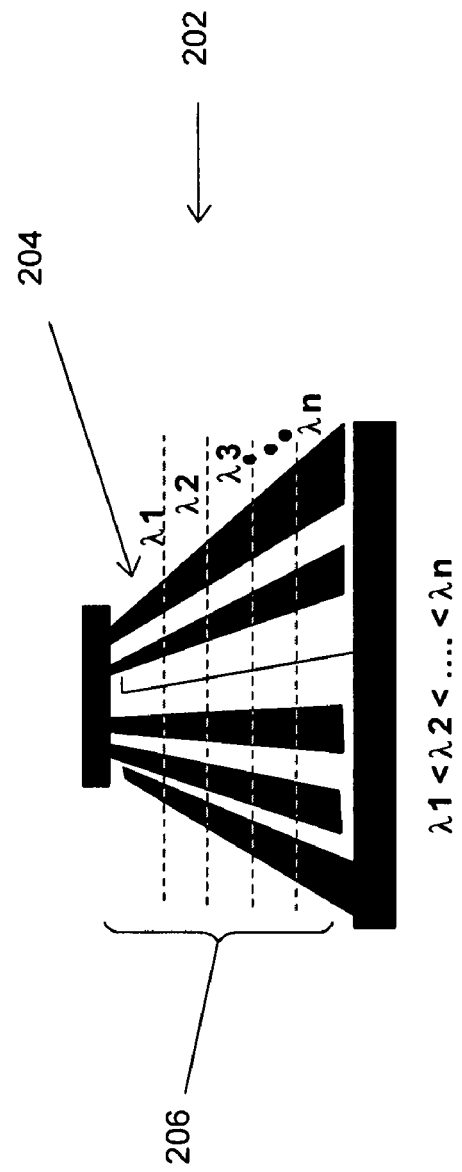
FIG. 2 is a representation of one implementation of an apparatus that comprises a tapered interdigital transducer.

Turning to FIG. 2, another example of a prior art surface acoustic wave filter 202 comprises a tapered IDT. The tapered IDT comprises a plurality of fingers 204 that are tapered to provide a wider fractional bandwidth. Since the spacing between the fingers 204 changes across the aperture, the frequencies passed by the tapered IDT change as well. For example, the plurality of fingers 204 are tapered such that the fractional bandwidth comprises a plurality of wavelengths $\lambda_1$, $\lambda_2$, $\lambda_3$, ... $\lambda_n$. In one example, the plurality of wavelengths overlaps to provide a continuous passband.

Turning to FIGS. 3-4, a first implementation of an apparatus 300 comprises a SAW filter 302. The SAW filter 302 in one example comprises a substrate 304, a base electrode 306, an insulating piezoelectric layer 308, at least one gradient electrode 310, an insulation layer 312, and an input transducer 314 and output transducer 316. The substrate 304 in one example comprises a sapphire substrate or other suitable material for a surface acoustic wave device. The base electrode 306 in one example is formed on top of the substrate 304. The base electrode 306 in one example comprises a thin metal electrode. In another example, the base electrode 306 comprises a doped semiconductor material, such as gallium nitride. The base electrode 306 may be either a highly resistive electrode or a highly conductive electrode so that it does not attenuate the surface wave, as will be appreciated by those skilled in the art.

The insulating piezoelectric layer 308 in one example is formed on top of the base electrode 306. The insulating piezoelectric layer 308 in one example comprises a layer of a semiconductor material, such as gallium nitride. The at least one gradient electrode 310 in one example is formed on top of the insulating piezoelectric layer 308. The at least one gradient electrode 310 in one example comprises a doped semiconductor material, such as gallium nitride, that has a high resistivity to reduce attenuation of the surface acoustic wave and to reduce interference with the operation of the transducers.

The insulation layer 312 in one example is formed on top of the gradient electrode 310. In one example, the insulation layer 312 comprises a layer of silicon nitride. The insulation layer 312 is configured to electrically insulate the transducers 314 and 316 from the gradient electrode 310. The transducers 314 and 316 are formed on the insulation layer 312. During operation of the SAW filter 302, an electrical signal is applied to the input transducer 314 that causes a surface acoustic wave to propagate in the SAW filter 302. The surface acoustic wave travels across an aperture 324 of the SAW filter 302. The output transducer 316 later converts the propagated acoustic wave into an output electrical signal, as will be appreciated by those skilled in the art.

The SAW filter 302 in one example further comprises a voltage source 318. The voltage source 318 in one example provides a direct current voltage bias to the base electrode 306 and the gradient electrode 310 through vias 320 and 322, respectively. The gradient electrode 310 is configured to provide a voltage gradient across the aperture 324. The base electrode 306 and the gradient electrode 310 are configured to provide a voltage bias across the insulating piezoelectric layer 308. The voltage bias across the insulating piezoelectric layer 308 is based on the voltage gradient across the aperture 324, as will be appreciated by those skilled in the art.

The at least one gradient electrode 310 in the implementation of FIGS. 3 and 4 comprises a set of six individual electrode strips 326, 328, 330, 332, 334, and 336. The voltage source 318 in one example is configured to provide a different uniform voltage to each electrode strip, which creates a voltage bias relative to the base electrode 306. For example, the voltage source 318 provides voltages V1, V2, V3, V4, V5, and V6 through a set of six vias 322 across the six voltage strips 326, 328, 330, 332, 334, and 336, respectively. The different voltage biases create a voltage gradient across the aperture 324. The electrode strips 310 in one example comprise a material with a high sheet resistivity so that the electrode strips do not attenuate the surface wave or interfere with the operation of the transducers 314 and 316, as will be appreciated by those skilled in the art.

Turning to FIGS. 5-6, a second implementation of the apparatus 300 comprises a SAW filter 502. The at least one gradient electrode 310 of the SAW filter 502 in one example comprises a resistive sheet 504, a first terminal 506, and a second terminal 508. The first terminal 506 is configured to receive a first voltage and the second terminal 508 is configured to receive a second voltage. The difference between the first and second voltages provides a voltage bias over the resistive sheet 504 that provides the voltage gradient across the aperture 324. The resistive sheet 504 in one example comprises a high sheet resistivity so that the resistive sheet 504 does not attenuate the surface wave or interfere with the operation of the transducers 314 and 316, as will be appreciated by those skilled in the art.

The base electrode 306 and the gradient electrode 310 in one example are configured to control at least one frequency characteristic of the SAW filter 502 based on the voltage bias across the insulating piezoelectric layer 308. In one example, an increase in the voltage bias across the insulating piezoelectric layer 308 lowers a center frequency of the SAW filter 502 for a first polarity of the voltage bias and raises the center frequency for a second polarity of the voltage bias. For example, the change in the piezoelectric changes a velocity of the surface wave and a frequency of the transducers 314 and 316. In another example, an increase in the voltage gradient across the aperture 324 causes an increase in the fractional bandwidth of the SAW filter 302. The direction of change in the velocity of the surface acoustic wave (i.e., a higher or lower velocity) is based on the polarity of the voltage bias and a polarity of the piezoelectric layer, as will be appreciated by those skilled in the art.

Figure 7:
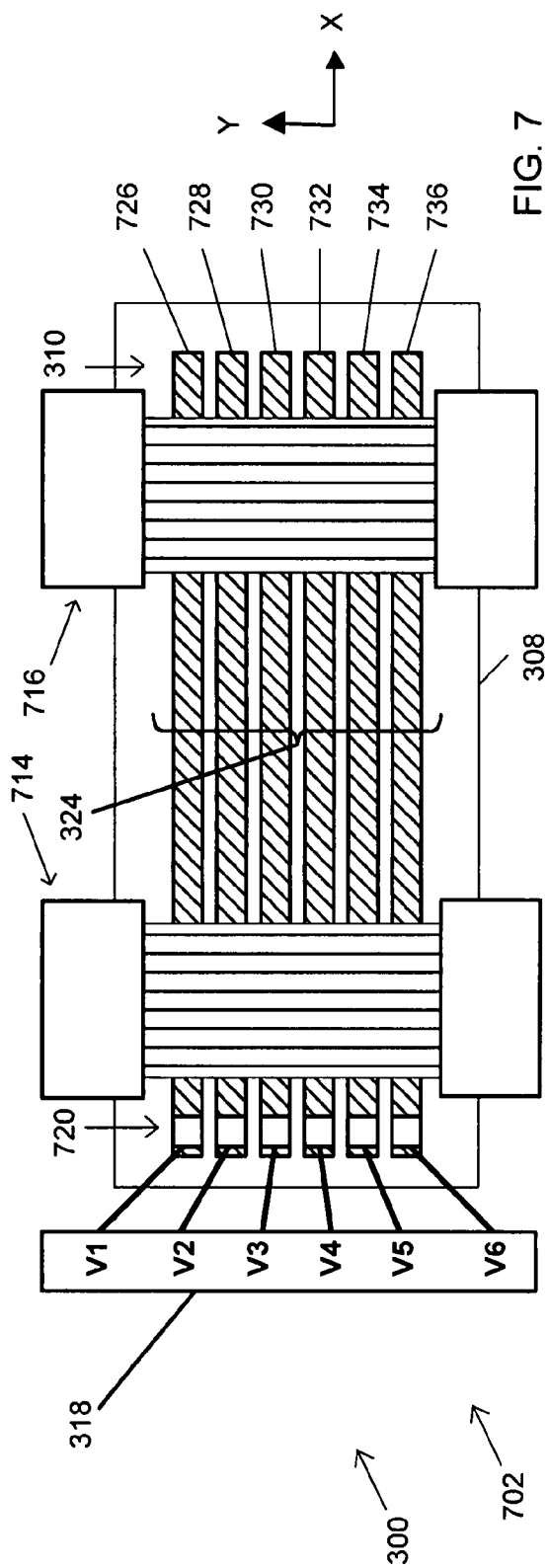
FIG. 7 is a top view representation of another implementation of the surface acoustic wave filter of FIG. 3.
Figure 8:
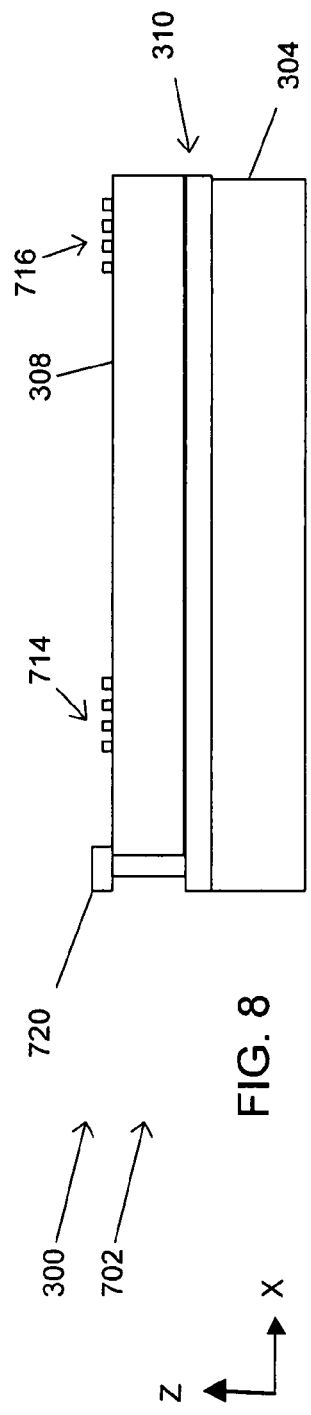
FIG. 8 is a side view representation of the surface acoustic wave filter of FIG. 7.

Turning to FIGS. 7-8, a third implementation of the apparatus 300 comprises a SAW filter 702. The SAW filter 702 in one example comprises the substrate 304, at least one gradient electrode 310, the insulating piezoelectric layer 308, an input transducer 714, an output transducer 716, and a plurality of vias 720. In this implementation, the at least one gradient electrode 310 comprises a plurality of electrode strips 726, 728, 730, 732, 734, and 736. The transducers 714 and 716 are configured to provide a direct current ground for the voltage bias. For example, the transducers 714 and 716 and the base electrode are integral. The voltage bias of the transducers 714 and 716 can be set to ground for the DC biasing while maintaining a non-short circuit for an RF signal through standard bias-T circuitry. The electrode strips are formed on top of the substrate 304 and receive the voltage bias through the vias 720. The insulating piezoelectric layer 308 is formed on top of the gradient electrode 310. The transducers 714 and 716 are formed on top of the insulating piezoelectric layer 308. In a further example, the insulating layer 312 may be formed between the insulating piezoelectric layer 308 and the transducers 714 and 716.

Figure 9:
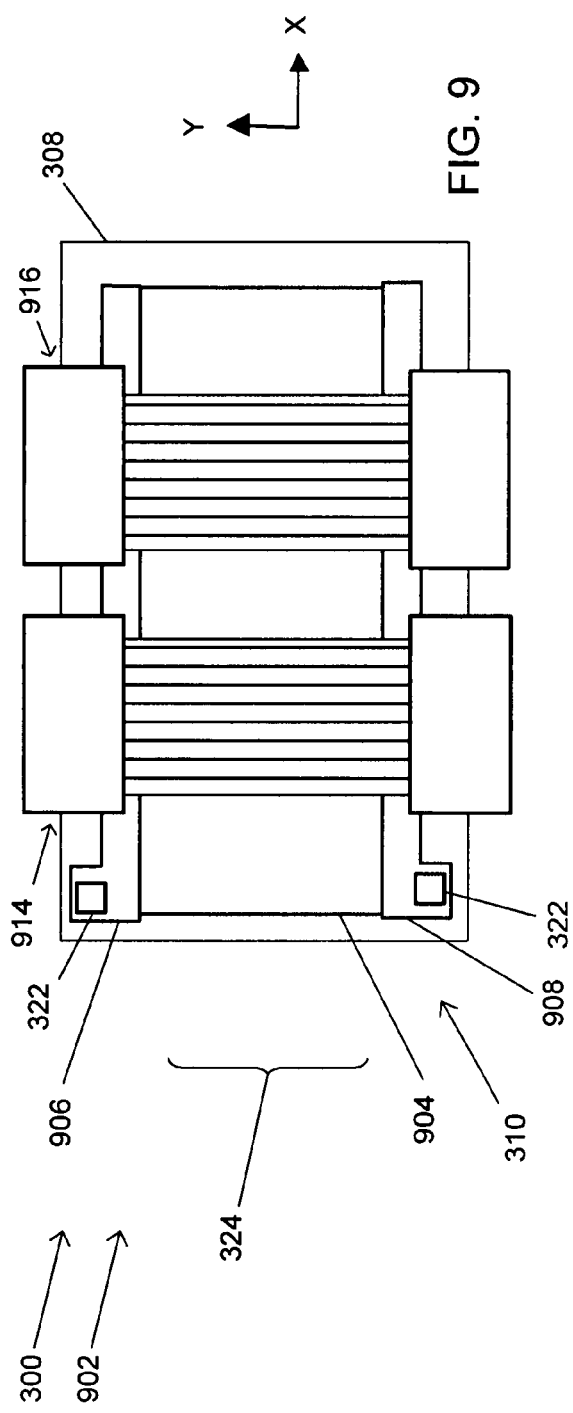
FIG. 9 is a top view representation of another implementation of the surface acoustic wave filter of FIG. 5.
Figure 10:
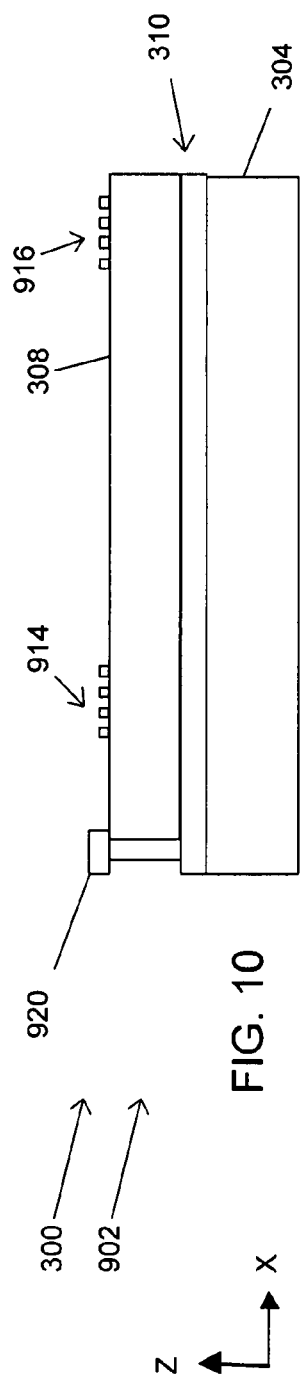
FIG. 10 is a side view representation of the surface acoustic wave filter of FIG. 9.

Turning to FIGS. 9-10, a fourth implementation of the apparatus 300 comprises a SAW filter 902. The SAW filter 902 comprises the substrate 304, at least one gradient electrode 310, the insulating piezoelectric layer 308, an input transducer 914, an output transducer 916, and vias 920. As described above, the voltage bias of the transducers 914 and 916 can be set to ground for the DC biasing while maintaining a non-short circuit for the RF signal through the bias-T circuitry. The at least one gradient electrode 310 comprises a resistive sheet 904, a first terminal 906, a second terminal 908. The difference between the voltages across the first terminal 906 and the second terminal 908 provides the voltage bias over the resistive sheet 904 that provides the voltage gradient across the aperture 324.

Figure 11:
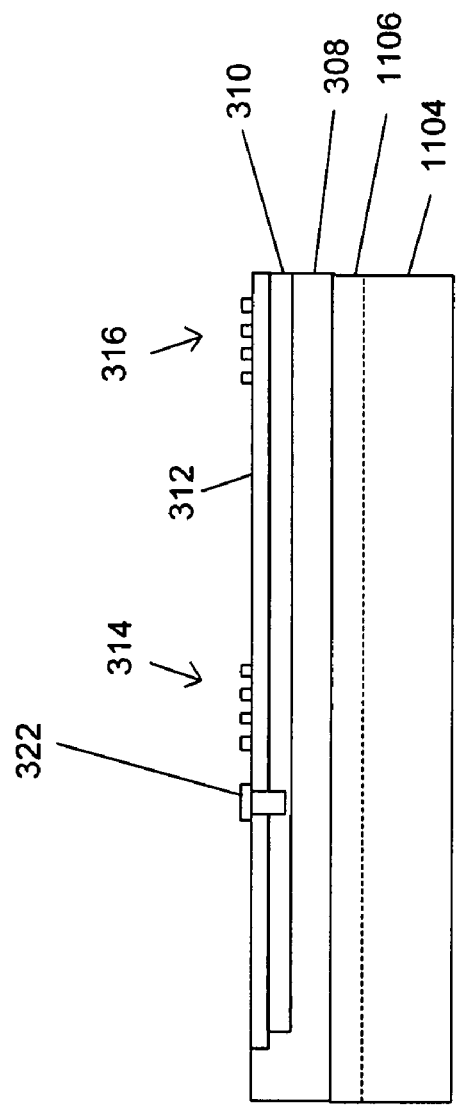
FIG. 11 is a side view representation of yet another implementation of the surface acoustic wave filter of FIG. 3 or 5.

Turning to FIG. 11, a fifth implementation of the apparatus 300 comprises a SAW filter 1102. The SAW filter 1102 comprises a substrate 1104, a base electrode 1106, the insulating piezoelectric layer 308, the at least one gradient electrode 310, and the transducers 314 and 316. In a further example, the SAW filter 1102 comprises the insulation layer 312 and vias 322. In this implementation, the substrate 1104 and the base electrode 1106 are integrally formed. For example, the substrate 1104 comprises a semiconductor material, such as silicon carbide, and the base electrode 1106 comprises a doped region of the semiconductor material. In this example, the doped region for the base electrode 1106 is doped to become resistive. The doped region may extend only partially through the substrate or through substantially all of the substrate. This implementation allows for the removal of the via 320 and simplifies fabrication. The velocity of the surface acoustic wave through the silicon carbide-based substrate in one example is higher than through the sapphire-based substrate and may be at least 20% higher. Accordingly, a same or similar design fabricated on the silicon carbide substrate will yield a higher frequency device, as will be appreciated by those skilled in the art.

The apparatus 300 in one example comprises a plurality of components such as one or more of electronic components, hardware components, and computer software components. A number of such components can be combined or divided in the apparatus 300. An example component of the apparatus 300 employs and/or comprises a set and/or series of computer instructions written in or implemented with any of a number of programming languages, as will be appreciated by those skilled in the art. The apparatus 300 in one example comprises any (e.g., horizontal, oblique, or vertical) orientation, with the description and figures herein illustrating one example orientation of the apparatus 300, for explanatory purposes.

The steps or operations described herein are just for example. There may be many variations to these steps or operations without departing from the spirit of the invention. For instance, the steps may be performed in a differing order, or steps may be added, deleted, or modified.

Although example implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
    an insulating piezoelectric layer;
    a base electrode along a first side of the insulating piezoelectric layer; and
    at least one gradient electrode along a second side of the insulating piezoelectric layer,
    wherein the at least one gradient electrode is configured to provide a voltage gradient across an aperture of a surface acoustic wave (SAW) filter;
    wherein the base electrode and the at least one gradient electrode are configured to provide a voltage bias across the insulating piezoelectric layer, wherein the voltage bias comprises a gradient based on the voltage gradient across the aperture of the SAW filter;
    wherein the base electrode and the at least one gradient electrode are configured to control at least one frequency characteristic of the SAW filter based on the voltage bias across the insulating piezoelectric layer;
    wherein the at least one frequency characteristic comprises one or more of a center frequency of the SAW filter and a fractional bandwidth of the SAW filter;
    wherein the insulating piezoelectric layer is formed on a semiconductor substrate that comprises the base electrode;
    wherein the semiconductor substrate comprises a doped region that forms the base electrode.

2. The apparatus of claim 1, wherein the at least one gradient electrode comprises a resistive sheet;
    wherein the resistive sheet provides the voltage gradient across the aperture of the SAW filter.

3. The apparatus of claim 2, wherein the resistive sheet comprises a first bias terminal and a second bias terminal on opposing sides of the resistive sheet;
    wherein the resistive sheet is configured to receive a voltage bias between the first bias terminal and the second bias terminal to provide the voltage gradient across the aperture of the SAW filter.

4. The apparatus of claim 1, wherein the at least one gradient electrode comprises a plurality of electrode strips that are configured to receive a plurality of voltages to provide the voltage bias across the insulating piezoelectric layer, wherein the plurality of voltages comprise at least two distinct voltages.

5. The apparatus of claim 4, wherein the plurality of electrode strips are arranged in parallel to extend from an input transducer to an output transducer of the SAW filter.

6. The apparatus of claim 1 in combination with the SAW filter, wherein the SAW filter comprises an input transducer and an output transducer;
    wherein the input transducer and the output transducer comprise regular interdigital transducers.

7. The apparatus of claim 1 in combination with the SAW filter, wherein the SAW filter comprises an input transducer and an output transducer;
    wherein the input transducer and the output transducer comprise tapered interdigital transducers.

8. The apparatus of claim 1, wherein the at least one frequency characteristic of the SAW filter comprises the center frequency of the SAW filter;
    wherein an increase in the voltage bias across the insulating piezoelectric layer lowers the center frequency of the SAW filter for a first polarity of the voltage bias and raises the center frequency of the SAW filter for a second polarity of the voltage bias.

9. The apparatus of claim 1, wherein the at least one frequency characteristic of the SAW filter comprises the fractional bandwidth of the SAW filter;

wherein an increase in the voltage gradient across the aperture causes an increase in the fractional bandwidth of the SAW filter.

10. The apparatus of claim 1, wherein the base electrode, the insulating piezoelectric layer, and the at least one gradient electrode comprise epitaxially grown semiconductor materials.

11. The apparatus of claim 10, wherein the base electrode comprises a first layer of doped gallium nitride formed on the semiconductor substrate;

wherein the insulating piezoelectric layer comprises a second layer of gallium nitride formed on the first layer;

wherein the at least one gradient electrode comprises a third layer of doped gallium nitride formed on the second layer.

12. The apparatus of claim 11 in combination with the SAW filter, wherein a fourth layer of silicon nitride is formed on the third layer;

wherein the SAW filter comprises an input transducer and an output transducer formed on the fourth layer;

wherein the fourth layer insulates the input transducer and the output transducer from the at least one gradient electrode.

13. The apparatus of claim 1 in combination with the SAW filter, wherein the SAW filter comprises an input transducer and an output transducer;

wherein the input transducer and the output transducer are integral with the base electrode wherein the input transducer and the output transducer are configured to provide a DC ground for the voltage bias across the insulating piezoelectric layer.

14. A surface acoustic wave (SAW) filter, comprising:
an insulating piezoelectric layer;
a base electrode formed along a first side of the insulating piezoelectric layer;
at least one gradient electrode formed along an opposing side of the insulating piezoelectric layer;
an input transducer and an output transducer,
wherein the base electrode and the at least one gradient electrode are configured to provide a voltage bias across an aperture of the insulating piezoelectric layer between the input transducer and the output transducer;
wherein the base electrode and the at least one gradient electrode are configured to control at least one of a center frequency and a fractional bandwidth of the SAW filter based on the voltage bias across the insulating piezoelectric layer;
wherein the insulating piezoelectric layer is formed on a semiconductor substrate that comprises the base electrode;
wherein the semiconductor substrate comprises a doped region that forms the base electrode.

15. The SAW filter of claim 14, wherein the base electrode, the insulating piezoelectric layer, and the at least one gradient electrode are epitaxially grown on the semiconductor substrate as an integral layer;

wherein the base electrode and the at least one gradient electrode comprises doped regions of the integral layer.

16. A method, comprising the steps of:
forming a base electrode as a first doped semiconductor layer;
forming an insulating piezoelectric layer on the base electrode as a second semiconductor layer;
forming at least one gradient electrode on the insulating piezoelectric layer as a third doped semiconductor layer, wherein the at least one gradient electrode is configured to provide a voltage gradient across an aperture of a surface acoustic wave (SAW) filter;
configuring the at least one gradient electrode to provide a voltage bias across the insulating piezoelectric layer, wherein the voltage bias comprises a gradient based on the voltage gradient across the aperture of the SAW device.

17. The method of claim 16, further comprising the step of:
adjusting a voltage gradient applied between the base electrode and the at least one gradient electrode to control at least one of a center frequency and a fractional bandwidth of the surface acoustic wave filter.

18. The method of claim 16, further comprising the steps of:
forming an insulation layer on the at least one gradient electrode;
forming an input transducer and an output transducer for a surface acoustic wave filter on the insulation layer for introduction of surface acoustic waves through the piezoelectric layer.

19. The method of claim 16, wherein the step of forming the at least one gradient electrode on the insulating piezoelectric layer as the third doped semiconductor layer comprises the step of:
forming the at least one gradient electrode across an aperture of the surface acoustic wave filter.

* * * * *